(12) United States Patent
Sim et al.

(10) Patent No.: US 10,135,418 B2
(45) Date of Patent: Nov. 20, 2018

(54) COMMON MODE FILTER

(71) Applicant: SAMSUNG ELECTRO-MECHANICS CO., LTD., Suwon-si, Gyeonggi-do (KR)

(72) Inventors: Won Chul Sim, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/439,633

(22) Filed: Feb. 22, 2017

(65) Prior Publication Data

US 2017/0310294 A1   Oct. 26, 2017

(30) Foreign Application Priority Data

Apr. 22, 2016 (KR) .................. 10-2016-0049484

(51) Int. Cl.
| H03H 7/01 | (2006.01) |
| H03H 7/42 | (2006.01) |
| H03H 7/24 | (2006.01) |
| H03H 1/00 | (2006.01) |

(52) U.S. Cl.
CPC .......... *H03H 7/427* (2013.01); *H03H 7/0115* (2013.01); *H03H 7/24* (2013.01); *H03H 2001/0085* (2013.01)

(58) Field of Classification Search
CPC ............... H03H 7/0115; H03H 7/427; H03H 2001/0085
USPC ........................................ 333/175, 181, 185
See application file for complete search history.

(56) References Cited

U.S. PATENT DOCUMENTS

| 8,922,303 B2 * | 12/2014 | Kameya ............... H01P 1/2039 |
| | | 333/204 |
| 2004/0212039 A1 | 10/2004 | Yamamoto |
| 2011/0285477 A1 | 11/2011 | Nakagawa et al. |
| 2014/0145796 A1 | 5/2014 | Okumura et al. |

FOREIGN PATENT DOCUMENTS

| JP | 2004-327941 A | 11/2004 |
| JP | 2006-140807 A | 6/2006 |
| JP | 2007-181169 A | 7/2007 |

(Continued)

OTHER PUBLICATIONS

Office Action dated May 22, 2017 issued in Korean Patent Application No. 10-2016-0049484.

(Continued)

*Primary Examiner* — Rakesh Patel
(74) *Attorney, Agent, or Firm* — McDermott Will & Emery LLP

(57) ABSTRACT

A common mode filter includes a body portion including a plurality of external electrodes disposed externally on the body portion, a first filter portion disposed within the body portion and including a plurality of coil electrode layers, and a second filter portion disposed within the body portion and including a plurality of coil electrode layers. The first filter portion and the second filter portion are connected to each other in series, and an area of the plurality of coil electrode layers of the first filter portion and an area of the plurality of coil electrode layers of the second filter portion are different from each other.

18 Claims, 9 Drawing Sheets

(56) References Cited

FOREIGN PATENT DOCUMENTS

| | | |
|---|---|---|
| JP | 2012-019443 A | 1/2012 |
| JP | 5029726 B2 | 9/2012 |
| JP | 2012-195332 A | 10/2012 |
| JP | 2012-238780 A | 12/2012 |
| JP | 2014-107435 A | 6/2014 |
| JP | 2014-175825 A | 9/2014 |

OTHER PUBLICATIONS

Japanese Office Action issued in corresponding Japanese Patent Application No. 2017-031605, dated Mar. 6, 2018, with English Translation.

\* cited by examiner

COMMON MODE FILTER

CROSS-REFERENCE TO RELATED APPLICATION(S)

This application claims benefit of priority to Korean Patent Application No. 10-2016-0049484 filed on Apr. 22, 2016 in the Korean Intellectual Property Office, the disclosure of which is incorporated herein by reference in its entirety.

TECHNICAL FIELD

The present disclosure relates to a common mode filter.

BACKGROUND

As technology advances, electronic devices such as mobile phones, home appliances, personal computers (PC), personal digital assistants (PDA), liquid crystal displays (LCD) have changed to use a digital scheme, rather than an analog scheme, and thus, processing speeds thereof have increased, according to an increase in data throughput. Thus, USB 2.0, USB 3.0, and high definition multimedia interfaces (HDMI) have come into widespread use as high-speed signal transmission interfaces, and such interfaces have been used in a range of digital devices, such as personal computers and digital high-definition television sets.

Such high-speed interfaces employ a differential signal system therein, transmitting differential signals, for example, differential mode signals, using a pair of signal lines, in a manner different from a single-end transmission system having been commonly used for a long period of time. However, since digitized and high-speed electronic devices are sensitive to external stimulation, signal distortion due to high-frequency noise has often been caused.

As causes of the occurrence of such abnormal voltages and noise, a switching voltage generated in circuits, power noise included in a power supply voltage, unnecessary electromagnetic signals or electromagnetic noise, and the like may be present. As a means of preventing such an abnormal voltage and high-frequency noise from being introduced into circuits, a common mode filter (CMF) has been used.

In order to remove common mode noise affecting communications sensitivity in future mobile devices, common mode filters will be required to have ultra-wideband attenuation characteristics in a relatively wide communications frequency band as compared to a current communications frequency band.

A common mode filter having a shunt electrode structure has been used to secure such ultra-wideband attenuation characteristics, but increasing a frequency domain of an existing shunt structure has limitations.

SUMMARY

An aspect of the present disclosure is to provide a common mode filter having ultra-wideband attenuation characteristics.

As aspect of the present disclosure is to provide a common mode filter having excellent attenuation characteristics in a lower frequency domain while having ultra-wideband attenuation characteristics.

According to an aspect of the present disclosure, a common mode filter includes a body portion including a plurality of external electrodes disposed externally on the body portion, a first filter portion disposed within the body portion and including a plurality of coil electrode layers, and a second filter portion disposed within the body portion and including a plurality of coil electrode layers. An area of the plurality of coil electrode layers of the first filter portion and an area of the plurality of coil electrode layers of the second filter portion are different from each other.

According to an aspect of the present disclosure, a common mode filter includes a body portion and first to fourth external electrodes disposed externally on the body portion. The body portion includes a first filter portion including a first coil and a second coil, a second filter portion including a third coil and a fourth coil, a first conductive via connecting the first and fourth coils to each other, and a second conductive via connecting the second and third coils to each other, and a resonant frequency of the first filter portion and a resonant frequency of the second filter portion are different from each other.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
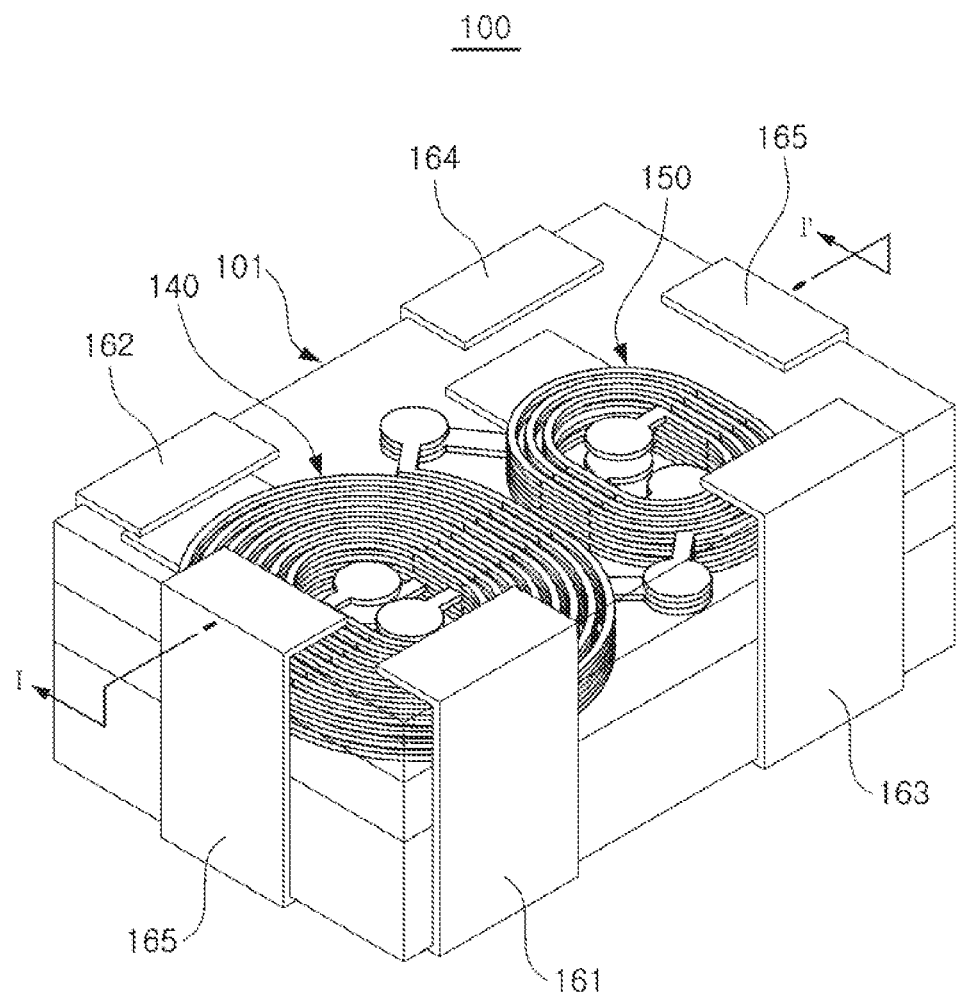
FIG. 1 is a schematic transparent perspective view of a common mode filter according to a first exemplary embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Figure 2:
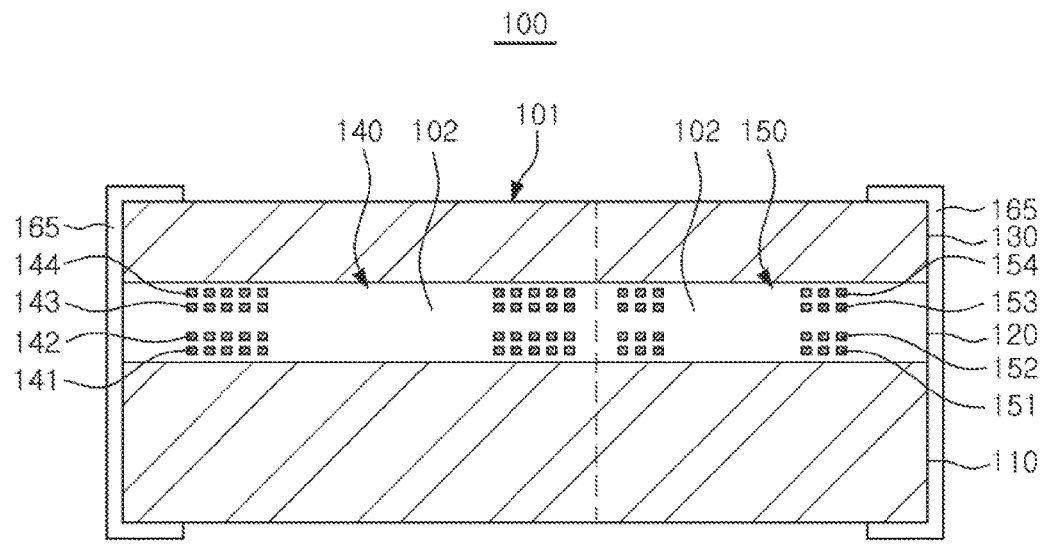
FIG. 2 is a schematic cross-sectional view taken along line I-I' of FIG. 1.
Figure 3A:
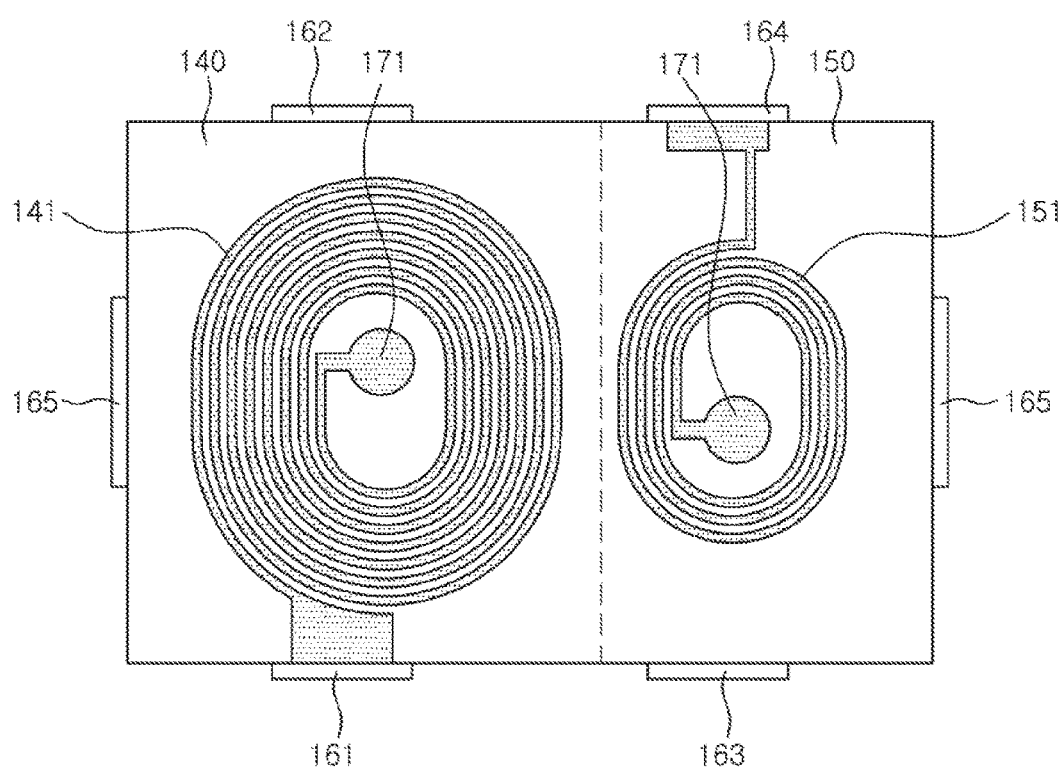
FIGS. 3A to 3D are a schematic plan view of coil electrode layers in the common mode filter according to the first exemplary embodiment in the present disclosure.
Figure 3B:
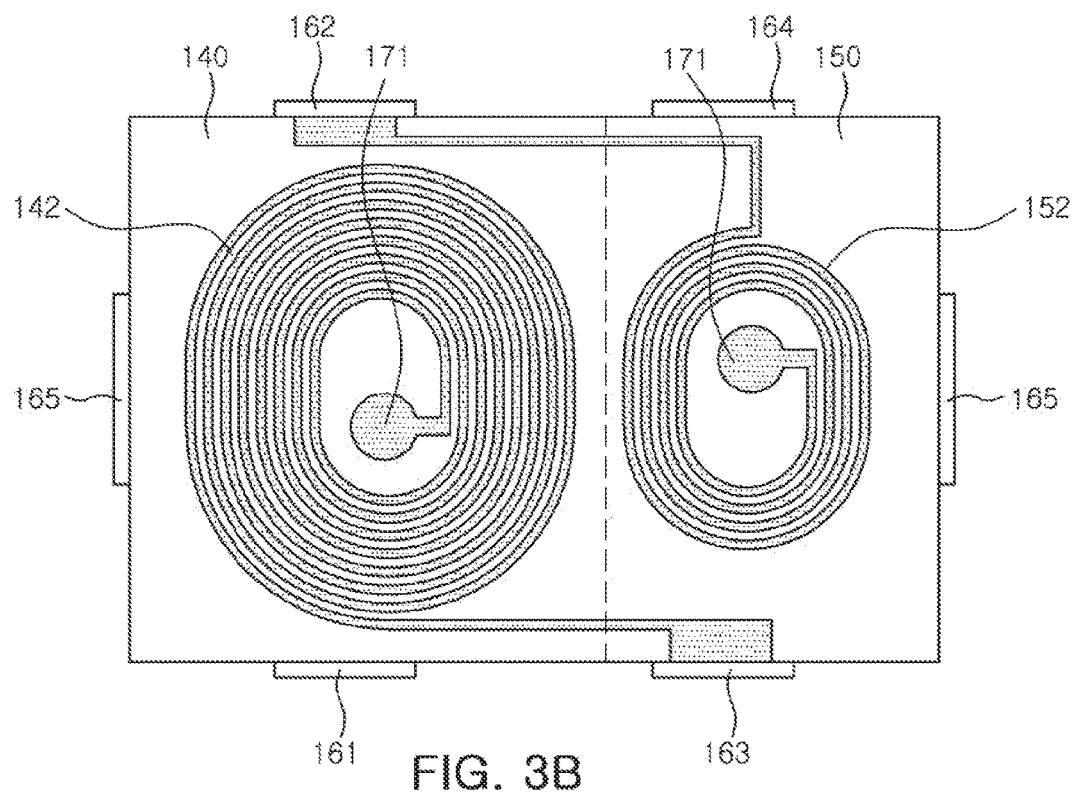
Figure 3C:
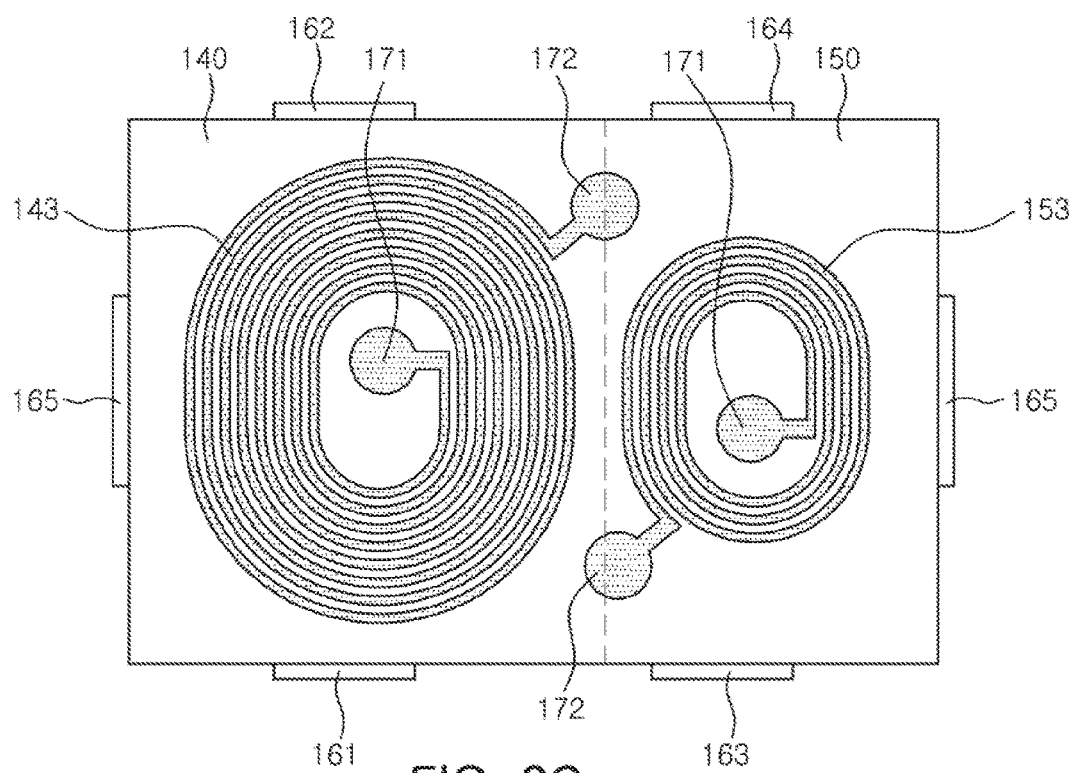
Figure 3D:
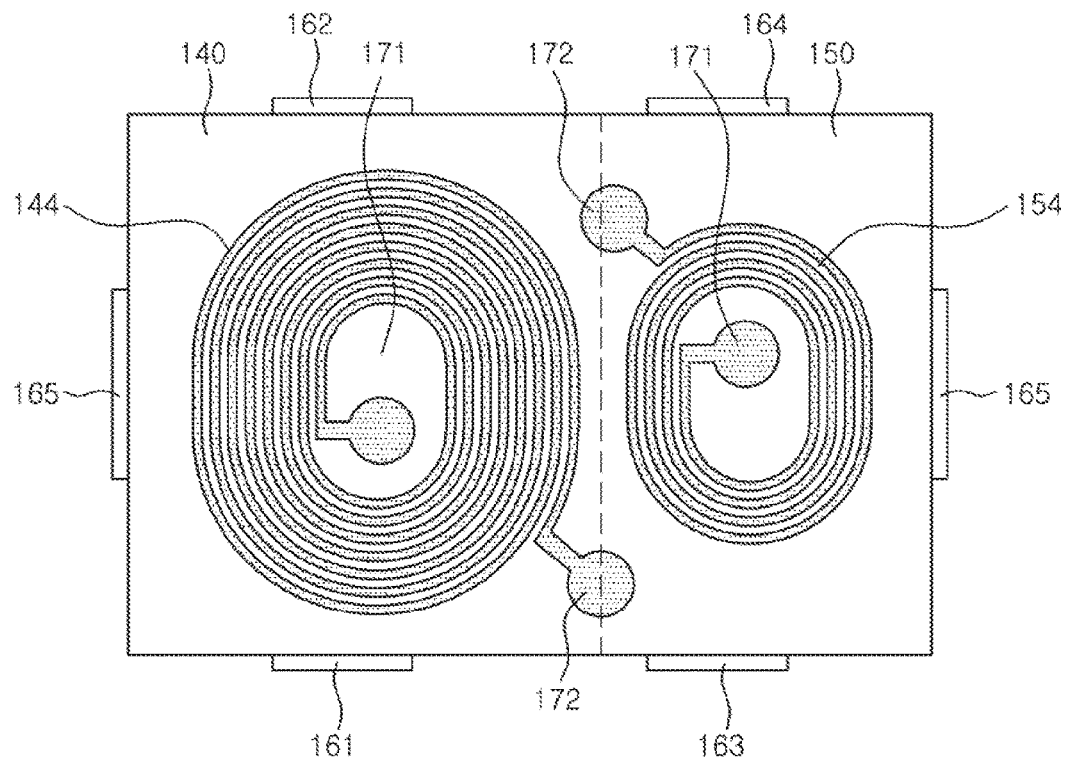

FIG. 1 is a schematic transparent perspective view of a common mode filter according to a first exemplary embodiment, while FIG. 2 is a schematic cross-sectional view taken along line I-I' of FIG. 1.

A configuration of a common mode filter 100 according to an exemplary embodiment will be described with reference to FIGS. 1 and 2. The common mode filter 100 may include a body portion 101, first and second filter portions 140 and 150 disposed within the body portion 101, and external electrodes 161, 162, 163 and 164 disposed on external surfaces of the body portion 101.

In addition, the common mode filter 100 may include ground electrodes 165 disposed on external surfaces of the body portion 101.

The external electrodes 161, 162, 163 and 164 may be disposed on side surfaces of the body portion 101 in a width direction, and the ground electrodes 165 may be disposed on end surfaces of the body portion 101 in a length direction.

The body portion 101 may include a substrate 110, a filter layer 120, and a cover layer 130.

The substrate 110, the filter layer 120, and the cover layer 130 may be formed of a magnetic ceramic material.

The filter layer 120 may include the first filter portion 140 and the second filter portion 150.

The filter layer 120 may serve to remove signal noise.

The filter portion 140 may include a plurality of coil electrode layers. For clarity of description, a case in which the first filter portion 140 includes first to fourth coil electrode layers 141, 142, 143 and 144 will be described by way of example.

The second filter portion 150 may include a plurality of coil electrode layers. For clarity of description, a case in which the second filter portion 150 includes fifth to eighth coil electrode layers 151, 152, 153 and 154 will be described by way of example.

The first to eighth coil electrode layers 141 to 144 and 151 to 154 may be formed by winding a conductive wire formed of a conductive material around an insulating layer at least one or more times to thus have a helical form, or may be formed using a conductive paste, a photoresist method, and the like.

In the case of the plurality of coil electrode layers 141 to 144 of the first filter portion 140 and the plurality of coil electrode layers 151 to 154 of the second filter portion 150, coils may be wound in a single direction, in such a manner that directions of magnetic flux generated in coils are opposite to each other, to decouple a magnetic flux of the first filter portion 140 from a magnetic flux of the second filter portion 150.

An area of the plurality of coil electrode layers 141 to 144 disposed in the first filter portion 140 may be different from an area of the plurality of coil electrode layers 151 to 154 disposed in the second filter portion 150.

For example, the area of the coil electrode layers 141 to 144 of the first filter portion 140 may be greater than the area of the coil electrode layers 151 to 154 of the second filter portion 150.

The area of the coil electrode layers may indicate an area inward of an outermost wire in the coil electrode layers.

In the case of the common mode filter 100 according to an exemplary embodiment, levels of inductance and parasitic capacitance of respective coil electrode layers 141 to 144 of the first filter portion 140 may be different from levels of inductance and parasitic capacitance of respective coil electrode layers 151 to 154 of the second filter portion 150, thereby allowing resonant frequencies of the first and second filter portions 140 and 150 to be different from each other.

Here, the resonant frequencies are defined by the following equation.

$$f_{res} = \frac{1}{2\pi \times \sqrt{L \times C}}$$

$f_{res}$: Resonant frequency of a common mode filter
L: Coupled inductance of two coils
C: Parasitic capacitance of the common mode filter coil Hereinafter, a case in which the area of the coil electrode layers 141 to 144 of the first filter portion 140 is greater than the area of the coil electrode layers 151 to 154 of the second filter portion 150, or a case in which a resonant frequency of the second filter portion 150 is higher than a resonant frequency of the first filter portion 140 will be described to illustrate an effect in an exemplary embodiment.

Figure 8:
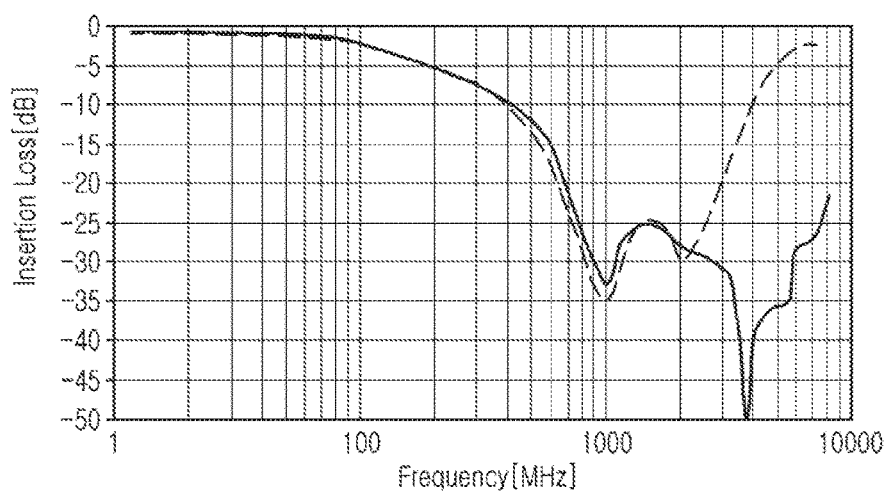
FIG. 8 is a graph illustrating transmission characteristics and attenuation characteristics of a common mode filter in a case in which a shunt electrode layer is not provided (represented by a broken line) and a case in which a shunt electrode layer is provided between sixth and seventh coil electrode layers of a second filter portion (represented by a solid line)

Referring to FIG. 8 to be described later, in a frequency band in a case in which a shunt electrode layer is not formed (represented by a broken line) as in the common mode filter 100 according to the first exemplary embodiment, a notch pole may be formed in a region of 1 GHz in the first filter portion 140, and 0.7 GHz to 1.5 GHz of attenuation characteristics may be provided, on the basis of –25 dB of attenuation. In addition, in the case of the second filter portion 150, it can be appreciated that a notch pole is formed in a region of 2 GHz, and 1.5 GHz to 2.5 GHz of attenuation characteristics may be provided, on the basis of –25 dB of attenuation. The first filter portion 140 may have an inductance greater than that of the second filter portion 150, and thus, may have increased attenuation as compared to that of the second filter portion 150.

FIGS. 3A to 3D are a schematic plan view of coil electrode layers in the common mode filter 100 according to the first exemplary embodiment. Referring to FIGS. 1 and 3, a structure in which the first to eighth coil electrode layers 141 to 144 and 151 to 154 are connected to one another will be described below.

First connection electrodes 171 may be disposed in central portions of the coil electrode layers to connect upper and lower coil electrode layers to each other via conductive vias penetrating through a dielectric 102, respectively. Second connection electrodes 172 may connect upper and lower coil electrode layers among the coil electrode layers disposed in the first and second filter portions 140 and 150, to each other, via conductive vias penetrating through the dielectric 102.

For example, the first coil electrode layer 141 and the third coil electrode layer 143 may be connected to each other via the first connection electrode 171 to thus form a first coil, and the second coil electrode layer 142 and the fourth coil electrode layer 144 may be connected to each other via the first connection electrode 171 to thus form a second coil.

In addition, the fifth coil electrode layer 151 and the seventh coil electrode layer 153 may be connected to each other via the first connection electrode 171 to thus form a third coil, and the sixth coil electrode layer 152 and the eighth coil electrode layer 154 may be connected to each other via the first connection electrode 171 to thus form a fourth coil.

For example, a first external electrode 161 may be connected to the first coil electrode layer 141, and the first coil electrode layer 141 may be connected to the third coil electrode layer 143 via the first connection electrode 171. The third coil electrode layer 143 disposed in the first filter portion 140 may be connected to the eighth coil electrode layer 154 disposed in the second filter portion 150 via the second connection electrode 172, and the eighth coil electrode layer 154 may be connected to the sixth coil electrode layer 152. The sixth coil electrode layer 152 may be connected to a second external electrode 162.

In addition, a third external electrode 163 may be connected to the second coil electrode layer 142, and the second coil electrode layer 142 may be connected to the fourth coil electrode layer 144 via the first connection electrode 171. The fourth coil electrode layer 144 disposed in the first filter portion 140 may be connected to the seventh coil electrode layer 153 disposed in the second filter portion 150 via the second connection electrode 172, and the seventh coil electrode layer 153 may be connected to the fifth coil electrode layer 151. The fifth coil electrode layer 151 may be connected to a fourth external electrode 164.

The first coil and the fourth coil may be connected to each other via a conductive via, and the second coil and the third coil may be connected to each other via a conductive via.

The conductive via connecting the first coil and the fourth coil to each other may be defined as a first conductive via, and the conductive via connecting the second coil and the third coil to each other may be defined as a second conductive via.

The first filter portion 140 and the second filter portion 150 may be connected to each other in series.

The serial connection between the first filter portion 140 and the second filter portion 150 may indicate that the first, third, eighth, and sixth coil electrode layers 141, 143, 154 and 152 are sequentially connected to one another in series, and the second, fourth, seventh and fifth coil electrode layers 142, 144, 153 and 151 are sequentially connected to one another in series.

Figure 5:
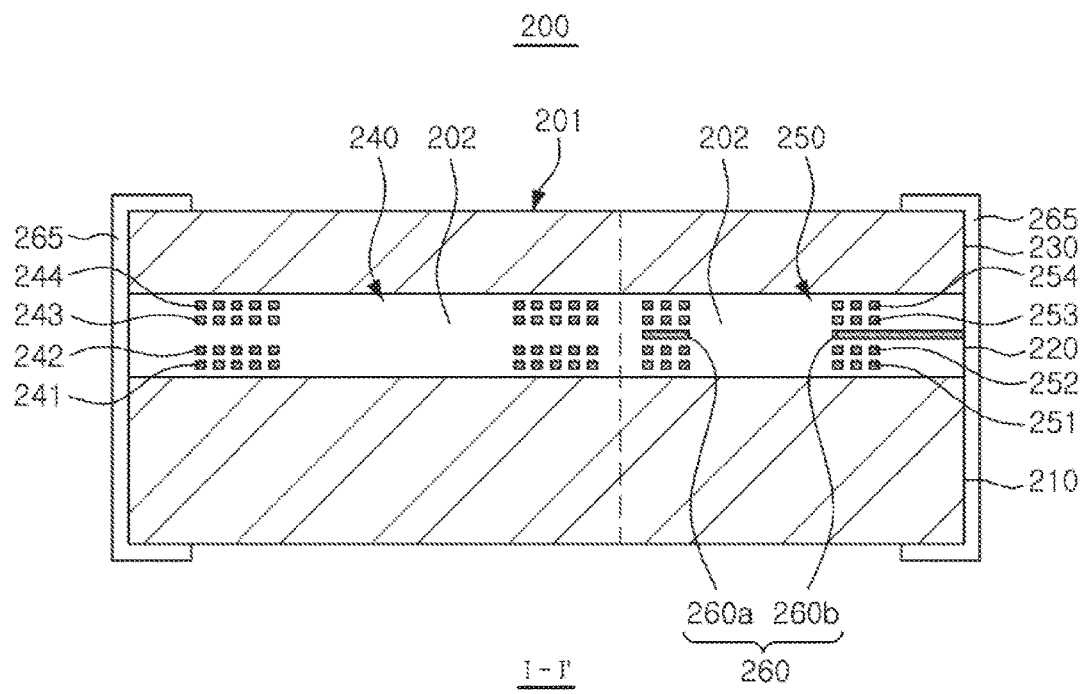
FIG. 5 is a schematic cross-sectional view of a common mode filter according to a second exemplary embodiment in the present disclosure.
Figure 6:
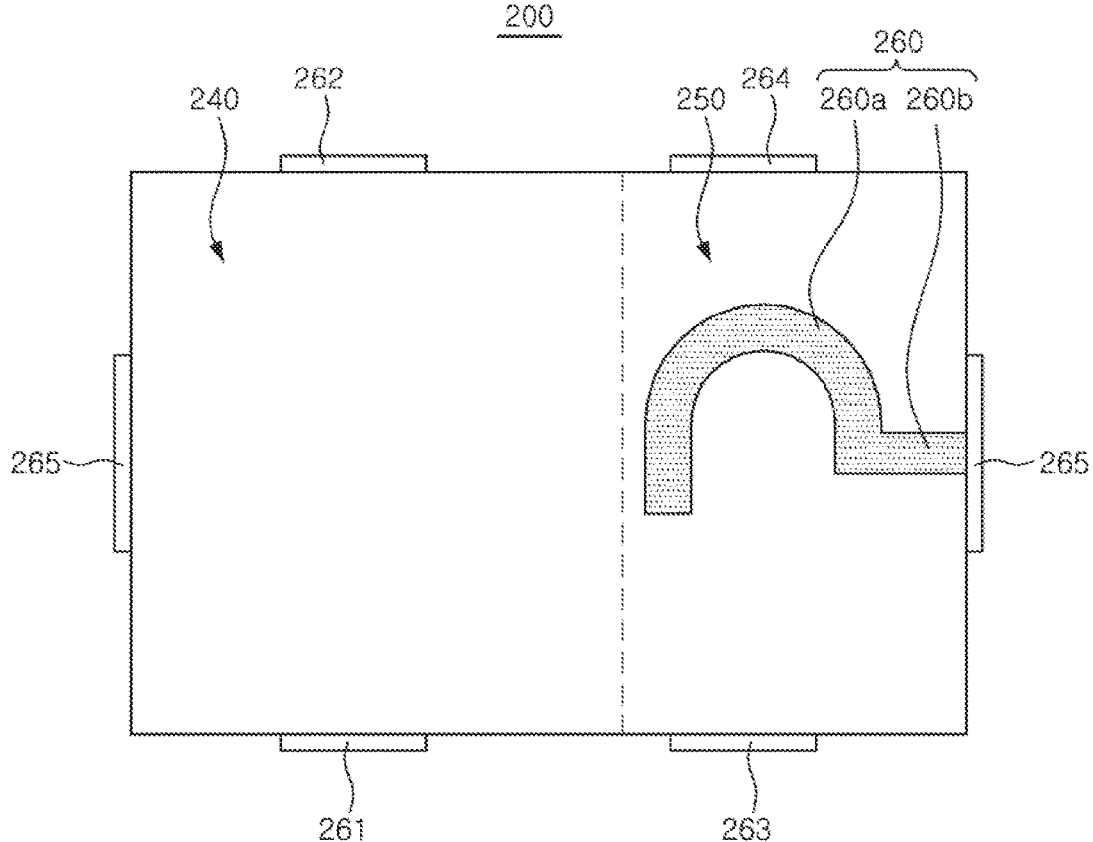
FIG. 6 is a schematic plan view of a shunt electrode layer in the common mode filter according to the second exemplary embodiment in the present disclosure.
Figure 7:
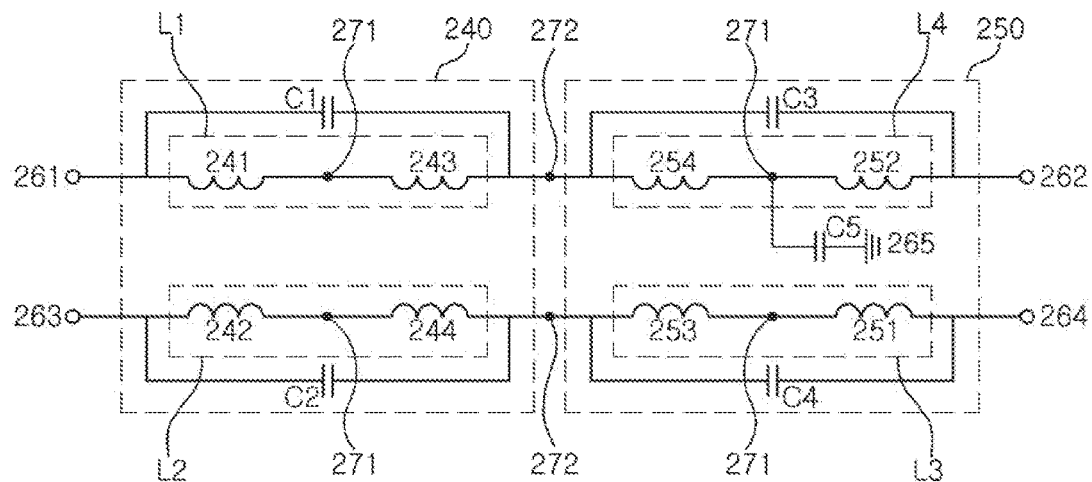
FIG. 7 is a schematic equivalent circuit diagram of the common mode filter according to the second exemplary embodiment in the present disclosure.

FIG. 5 is a schematic cross-sectional view of a common mode filter 200 according to a second exemplary embodiment, FIG. 6 is a schematic plan view of a shunt electrode layer 260 in the common mode filter 200 according to the second exemplary embodiment, and FIG. 7 is a schematic equivalent circuit diagram of the common mode filter 200 according to the second exemplary embodiment.

Figure 4:
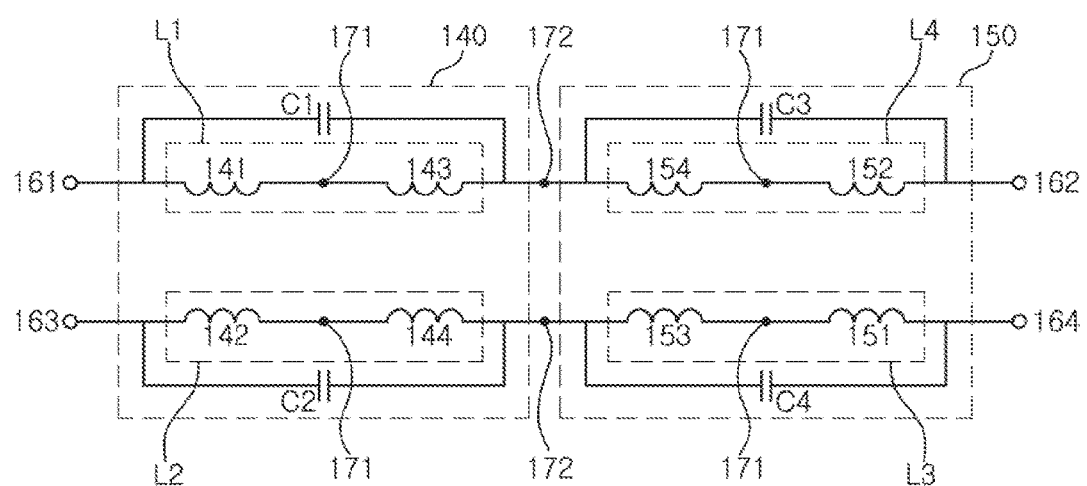
FIG. 4 is a schematic equivalent circuit diagram of the common mode filter according to the first exemplary embodiment in the present disclosure.

A structure of the common mode filter 200 according to the second exemplary embodiment will be described with reference to FIGS. 4 and 6. A description of constituent elements identical to those of the common mode filter 100 of the first exemplary embodiment will be omitted.

Hereinafter, a case in which an area of coil electrode layers 241 to 244 of a first filter portion 240 is greater than an area of coil electrode layers 251 to 254 of a second filter portion 250, or a case in which a resonant frequency of the second filter portion 250 is higher than a resonant frequency of the first filter portion 240, will be described to illustrate a structure and an effect in an exemplary embodiment.

A shunt electrode layer 260 may be disposed between at least portions of the plurality of coil electrode layers 251, 252, 253 and 254.

As illustrated in FIG. 5, the shunt electrode layer 260 may be located between sixth and seventh coil electrode layers 252 and 253 corresponding to a central portion of the plurality of coil electrode layers 251, 252, 253 and 254.

In addition, the shunt electrode layer 260 may be disposed between the fifth and sixth coil electrode layers 251 and 252 or between the seventh and eighth coil electrode layers 253 and 254.

With reference to FIG. 6, the shunt electrode layer 260 may include a shunt portion 260a and a lead-out portion 260b. The lead-out portion 260b may be connected to a ground electrode 265 disposed on an external surface of a body portion 201, to allow the shunt electrode layer 260 to be grounded.

The common mode filter 200 according to the second exemplary embodiment may include at least two shunt electrode layers 260.

For example, when at least two shunt electrode layers 260 are provided, one shunt electrode layer 260 may be connected to one ground electrode 265.

In other words, when the shunt electrode layers 260 are provided as at least two layers, the ground electrode 265 may also be provided as the same number as the number of shunt electrode layers 260.

In a manner different therefrom, a plurality of shunt electrode layers 260 may also be connected to one ground electrode 265.

For example, when the shunt electrode layer 260 is provided as two shunt electrode layers, the shunt electrode layers 260 may be disposed between fifth and sixth coil electrode layers 251 and 252 and between seventh and eighth coil electrode layers 253 and 254. Alternatively, the shunt electrode layers 260 may be disposed between the fifth and sixth coil electrode layers 251 and 252 and between the sixth and seventh coil electrode layers 252 and 253, or may be disposed between the sixth and seventh coil electrode layers 252 and 253 and between the seventh and eighth coil electrode layers 253 and 254.

For example, when the shunt electrode layer 260 is provided as three shunt electrode layers, the shunt electrode layers 260 may be disposed in respective gaps between the fifth to eighth coil electrode layers 251 to 254.

The shunt electrode layer 260 may have a flat plate shape corresponding to that of a coil adjacent thereto.

In a manner different from that of the common mode filter 100 of the first exemplary embodiment, since the common mode filter 200 according to the second exemplary embodiment includes the shunt electrode layer 260 disposed between at least portions of the plurality of coil electrode layers included in the second filter portion 250, it can be seen that a capacitor C5 is provided in the second filter portion 250, as illustrated in FIG. 7. The capacitor C5 may be referred to as a shunt capacitor.

Hereinafter, with reference to FIG. 8, an effect in which the common mode filter 200 according to the second exemplary embodiment includes the shunt electrode layer 260 disposed between at least portions of the plurality of coil electrode layers included in the second filter portion 250 will be described below.

FIG. 8 is a graph illustrating transmission characteristics and attenuation characteristics of a common mode filter in a case in which a shunt electrode layer is not provided (represented by a broken line) and a case in which a shunt electrode layer is provided between sixth and seventh coil electrode layers of a second filter portion (represented by a solid line).

In a frequency band in a case in which a shunt electrode layer is not provided (represented by a broken line) as in the common mode filter 100 according to the first exemplary embodiment, a notch pole may be formed in a region of 1 GHz in the first filter portion 140, and 0.7 GHz to 1.5 GHz of attenuation characteristics may be provided, on the basis of −25 dB of attenuation. In addition, in the case of the second filter portion 150, it can be appreciated that a notch pole is formed in a region of 2 GHz, and 1.5 GHz to 2.5 GHz of attenuation characteristics may be provided, on the basis of −25 dB of attenuation.

However, in a manner different from that of the common mode filter 100 of the first exemplary embodiment, since the common mode filter 200 according to the second exemplary embodiment includes the shunt electrode layer 260 disposed between at least portions of the plurality of coil electrode layers included in the second filter portion 250, it can be seen that when attenuation characteristics are measured, one pole is added in a measurement graph to thus represent a total of two poles, and thus, attenuation characteristics are improved in a relatively wide frequency domain.

In detail, in a frequency band in a case in which a shunt electrode layer is provided (represented by a solid line) as in the common mode filter 200 according to the second exemplary embodiment, a notch pole may be formed in a region of 1 GHz in the first filter portion 240 in the same manner as the common mode filter 100 of the first exemplary embodiment, and 0.7 GHz to 1.5 GHz of attenuation characteristics may be provided, on the basis of −25 dB of attenuation. However, in the case of the second filter portion 250, it can be appreciated that another notch pole is formed in a region of 3.8 GHz, and 1.5 GHz to 7.0 GHz of attenuation characteristics may be obtained, on the basis of −25 dB of attenuation.

In detail, in this case, it can be seen that attenuation in the second filter portion 250 is significantly increased differently from the case in which the shunt electrode layer is not provided (represented by a broken line).

For example, in the case of the second common mode filter 200 according to the second exemplary embodiment, it can be appreciated that attenuation characteristics may be sufficiently satisfied in an ultra-wideband communications frequency band of 0.7 GHz to 7.0 GHz required in the future.

Figure 9:
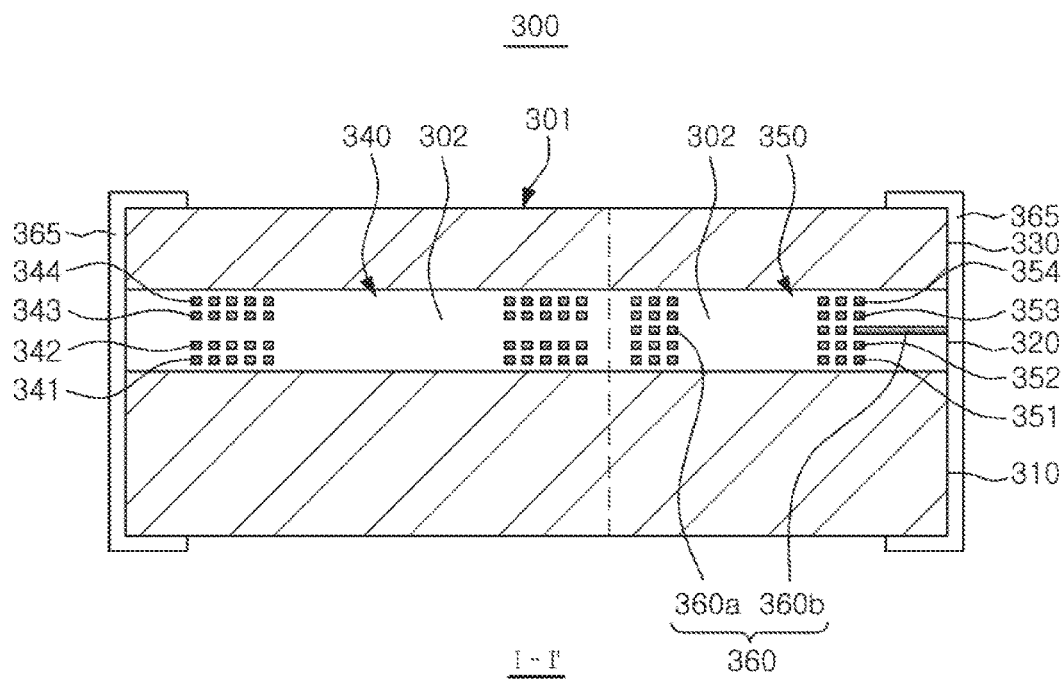
FIG. 9 is a schematic cross-sectional view of a common mode filter according to a third exemplary embodiment in the present disclosure.
Figure 10:
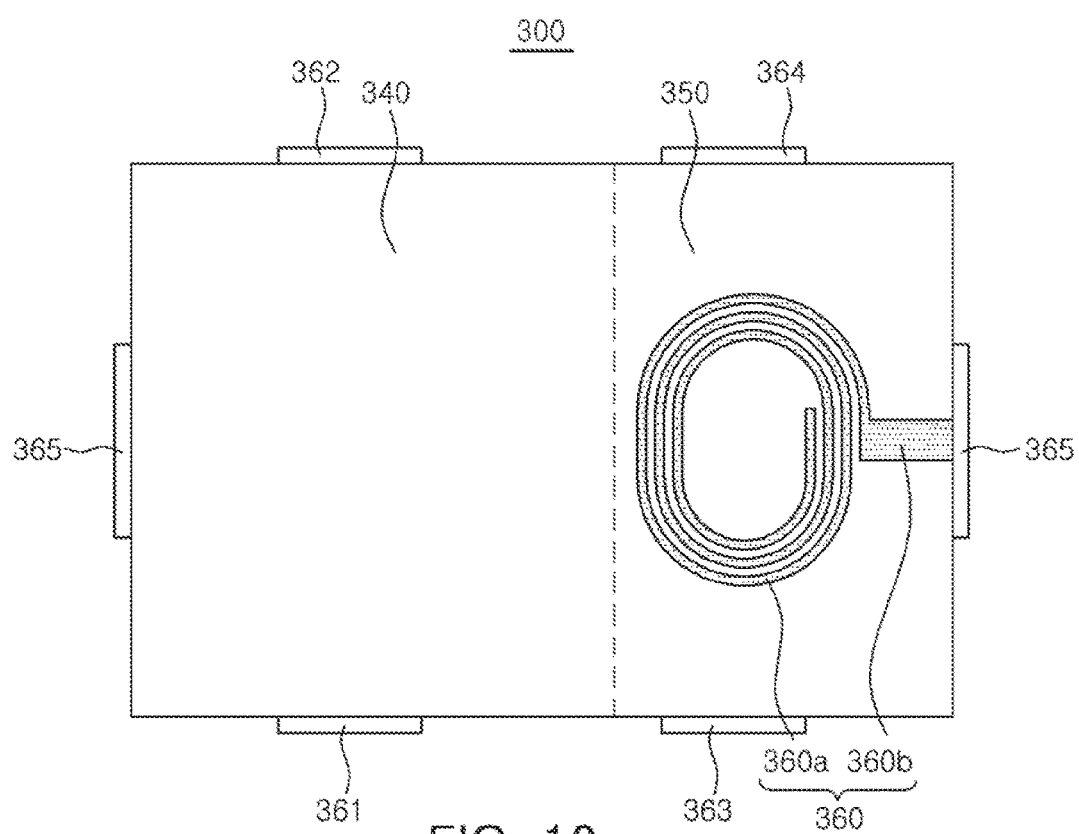
FIG. 10 is a schematic plan view of a shunt electrode layer in the common mode filter according to the third exemplary embodiment in the present disclosure.
Figure 11:
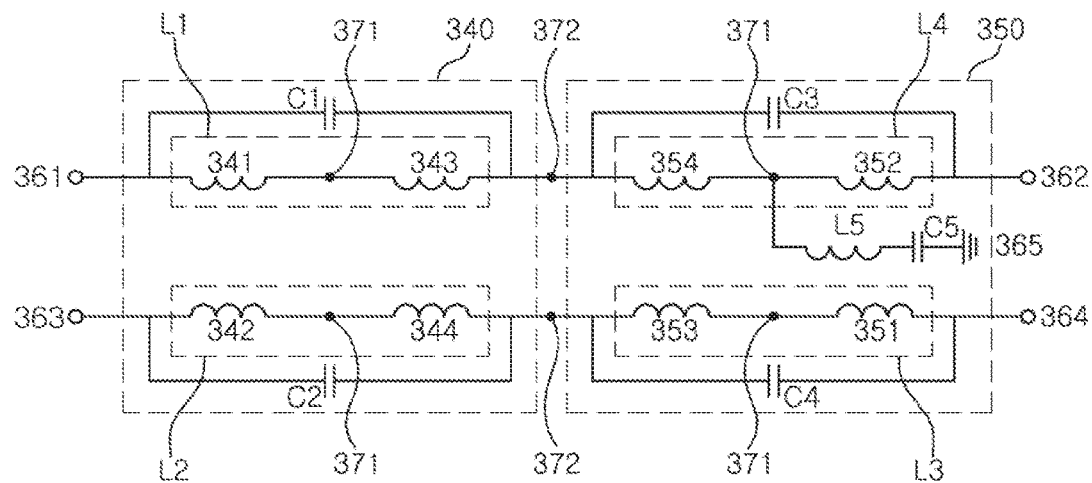
FIG. 11 is a schematic equivalent circuit diagram of the common mode filter according to the third exemplary embodiment in the present disclosure.

FIG. 9 is a schematic cross-sectional view of a common mode filter 300 according to a third exemplary embodiment, FIG. 10 is a schematic plan view of a shunt electrode layer 360 in the common mode filter 300 according to the third exemplary embodiment, and FIG. 11 is a schematic equivalent circuit diagram of the common mode filter 300 according to the third exemplary embodiment.

A structure of the common mode filter 300 according to the third exemplary embodiment will be described with reference to FIGS. 8 and 10. A description of constituent elements identical to those of the common mode filters 100 and 200 of the first and second exemplary embodiments will be omitted.

Hereinafter, a case in which an area of coil electrode layers 341 to 344 of a first filter portion 340 is greater than an area of coil electrode layers 351 to 354 of a second filter portion 350, or a case in which a resonant frequency of the second filter portion 350 is higher than a resonant frequency of the first filter portion 340, will be described to illustrate a structure and an effect in an exemplary embodiment.

In the case of the common mode filter 300 according to the third exemplary embodiment, the shunt electrode layer 360 may have a coil shape in a manner different from the case of the common mode filter 200 according to the second exemplary embodiment.

The shunt electrode layer 360 and coil electrode layers 352 and 353 adjacent thereto may have regions corresponding to each other in a vertical direction. Although the case in which the shunt electrode layer 360 is disposed between the sixth and seventh coil electrode layers 352 and 353 is illustrated by way of example, the shunt electrode layer 360 may also be disposed between the fifth and sixth coil electrode layers 351 and 352 or between the seventh and eighth coil electrode layers 353 and 354. Thus, in this case, the shunt electrode layer 360 and the coil electrode layers adjacent thereto may also have regions corresponding to each other in a vertical direction.

With reference to FIG. 10, the shunt electrode layer 360 may include a shunt portion 360a and a lead-out portion 360b. The lead-out portion 360b may be connected to a ground electrode 365 disposed on an external surface of a body portion 301, to allow the shunt electrode layer 360 to be grounded. As illustrated in FIG. 10, the shunt portion 360a may have a coil shape.

Referring to a portion illustrated as being grounded with reference to FIG. 10, it can be seen that inductance L5 besides capacitance C5 generated by the shunt electrode layer 360 is generated.

In the case of the common mode filter 300 according to the third exemplary embodiment, since the shunt electrode layer 360 has a coil shape, a frequency band having attenuation characteristics may be controlled by adjusting a level of inductance of the second filter portion 350.

Figure 12:
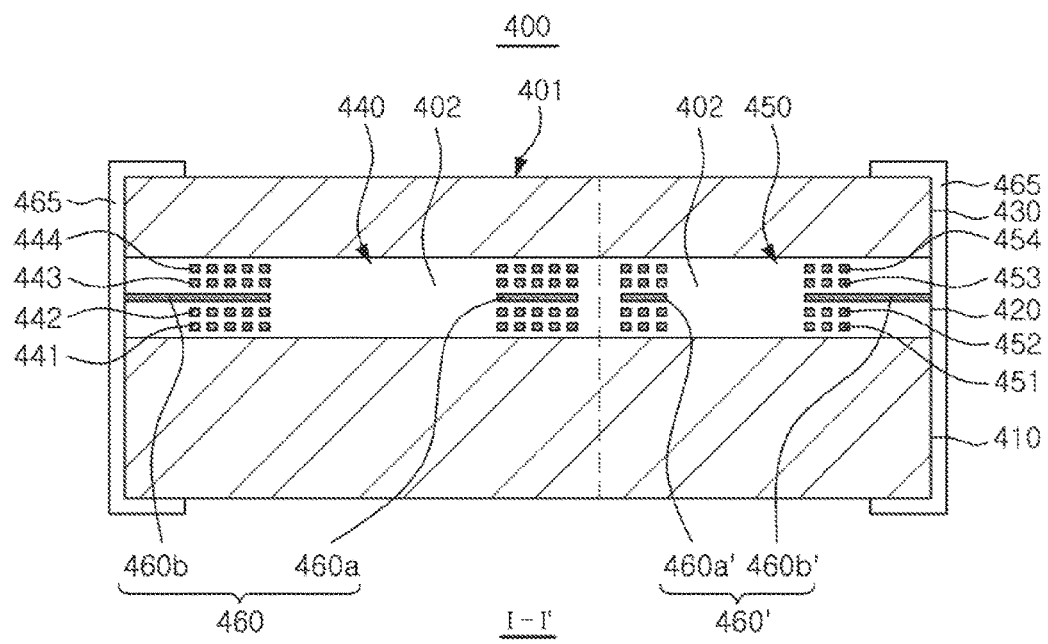
FIG. 12 is a schematic cross-sectional view of a common mode filter according to a fourth exemplary embodiment in the present disclosure.
Figure 13:
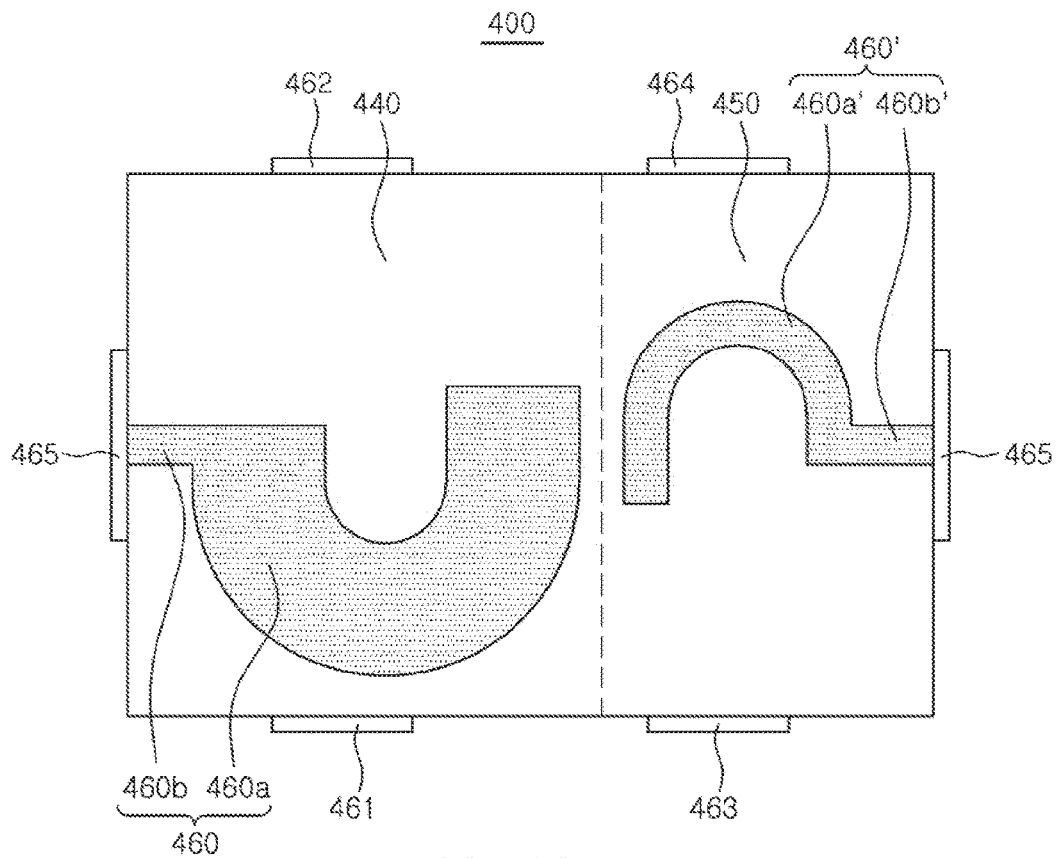
FIG. 13 is a schematic plan view of a shunt electrode layer in the common mode filter according to the fourth exemplary embodiment in the present disclosure.
Figure 14:
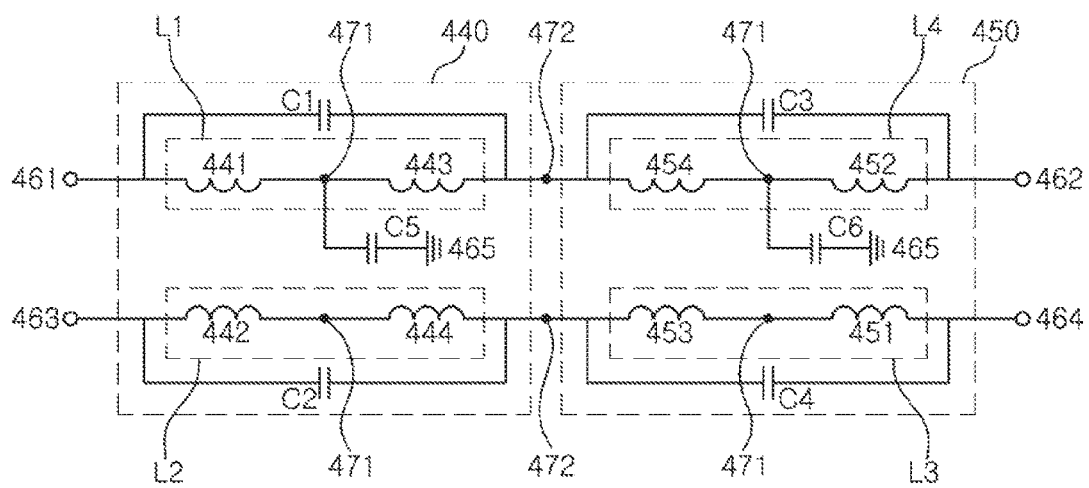
FIG. 14 is a schematic equivalent circuit diagram of the common mode filter according to the fourth exemplary embodiment in the present disclosure.

FIG. 12 is a schematic cross-sectional view of a common mode filter 400 according to a fourth exemplary embodiment, FIG. 13 is a schematic plan view of shunt electrode layers 460 and 460' in the common mode filter 400 according to the fourth exemplary embodiment, and FIG. 14 is a schematic equivalent circuit diagram of the common mode filter 400 according to the fourth exemplary embodiment.

Hereinafter, a structure of the common mode filter 400 according to the fourth exemplary embodiment will be described with reference to FIGS. 11 and 13. A description of constituent elements identical to those of the common mode filters 100, 200 and 300 of the first to third exemplary embodiments will be omitted.

Hereinafter, a case in which an area of coil electrode layers 441 to 444 of a first filter portion 440 is greater than an area of coil electrode layers 451 to 454 of a second filter portion 450, or a case in which a resonant frequency of the second filter portion 450 is higher than a resonant frequency of the first filter portion 440, will be described to illustrate a structure and an effect in an exemplary embodiment.

The shunt electrode layer 460 may be disposed between at least portions of a plurality of coil electrode layers 441, 442, 443 and 444 of the first filter portion 440, and the shunt electrode layer 460' may also be disposed between at least portions of a plurality of coil electrode layers 451, 452, 453 and 454 of the second filter portion 450.

The shunt electrode layer 460 of the first filter portion 440 may be located between second and third coil electrode layers 442 and 443 corresponding to a central portion of the plurality of coil electrode layers 441, 442, 443 and 444. In addition, the shunt electrode layer 460' of the first filter portion 440 may also be disposed between the first and second coil electrode layers 441 and 442 or between the third and fourth coil electrode layers 443 and 444.

The shunt electrode layer 460' of the second filter portion 450 may be located between sixth and seventh coil electrode layers 452 and 453 corresponding to a central portion of the plurality of coil electrode layers 451, 452, 453 and 454. In addition, the shunt electrode layer 460' of the second filter portion 450 may be disposed between the fifth and sixth coil electrode layers 451 and 452 or between the seventh and eighth coil electrode layers 453 and 454.

With reference to FIG. 13, the shunt electrode layer 460 of the first filter portion 440 may include a shunt portion 460a and a lead-out portion 460b. The lead-out portion 460b may be connected to a ground electrode 465 disposed on an external surface of a body portion 401, to allow the shunt electrode layer 460 to be grounded. The shunt electrode layer 460' of the second filter portion 450 may include a shunt portion 460a' and a lead-out portion 460b'. The lead-out portion 460b' may be connected to a ground electrode 465 disposed on an external surface of the body portion 401, to allow the shunt electrode layer 460 to be grounded.

In the case of the common mode filter 400 according to the fourth exemplary embodiment, since the shunt electrode layers 460 and 460' are included in the first and second filter portions 440 and 450, it can be seen that capacitors C5 and C6 are provided in the first and second filter portions 440 and 450, respectively, as illustrated in FIG. 14. The capacitors C5 and C6 may be referred to as shunt caps.

The shunt electrode layers 460 and 460' of the first and second filter portions 440 and 450 may have a flat plate shape corresponding to those of coils adjacent thereto.

Alternatively, the shunt electrode layers 460 and 460' of the first and second filter portions 440 and 450 may have a coil shape corresponding to those of coils adjacent thereto.

As set forth above, since a common mode filter according to an exemplary embodiment includes first and second filter portions of which areas of coil filter layers are different from each other, ultra-wideband attenuation characteristics may be obtained.

In addition, a common mode filter according to an exemplary embodiment may have ultra-wideband attenuation characteristics, simultaneously with having excellent attenuation characteristics in a low frequency domain.

While example embodiments have been shown and described above, it will be apparent to those skilled in the art that modifications and variations could be made without departing from the scope of the present inventive concept as defined by the appended claims.

What is claimed is:

1. A common mode filter comprising:
   a body portion including a plurality of external electrodes disposed externally on the body portion;
   a first filter portion disposed within the body portion and including a plurality of coil electrode layers;
   a second filter portion disposed within the body portion and including a plurality of coil electrode layers; and
   a first shunt electrode layer disposed between at least portions of the plurality of coil electrode layers included in the second filter portion,
   wherein the first filter portion and the second filter portion are connected to each other in series, and an area of the plurality of coil electrode layers of the first filter portion is greater than an area of the plurality of coil electrode layers of the second filter portion.

2. The common mode filter of claim 1, further comprising a second shunt electrode layer disposed between the plurality of coil electrode layers included in the first filter portion.

3. The common mode filter of claim 2, wherein the second shunt electrode layer disposed in the first filter portion has a flat plate shape or a coil shape.

4. The common mode filter of claim 1, wherein the first shunt electrode layer has a flat plate shape or a coil shape.

5. The common mode filter of claim 1, having −25 dB or less of attenuation from a 0.7 GHz band to a 7.0 GHz band.

6. The common mode filter of claim 1, further comprising a ground electrode disposed externally on the body portion,
wherein the first shunt electrode layer is electrically connected to the ground electrode.

7. A common mode filter comprising:
a body portion, and a first external electrode, a second external electrode, a third external electrode, and a fourth external electrode disposed externally on the body portion,
wherein the body portion includes a first filter portion including a first coil and a second coil, a second filter portion including a third coil and a fourth coil, a first conductive electrode connecting the first and fourth coils to each other, and a second conductive electrode connecting the second and third coils to each other, and
the body portion further includes a shunt electrode layer disposed between the third coil and the fourth coil of the second filter portion,
a resonant frequency of the first filter portion is lower than a resonant frequency of the second filter portion.

8. The common mode filter of claim 7, wherein the first external electrode is connected to the second external electrode via the first coil and the fourth coil, and the third external electrode is connected to the fourth external electrode via the second coil and the third coil.

9. A common mode filter comprising:
a body portion;
a first filter portion embedded in the body portion and including a first plurality of coil electrode layers; and
a second filter portion embedded in the body portion and including a second plurality of coil electrode layers occupying an area different from that of any of the first plurality of coil electrode layers; and
a shunt capacitor formed of a shunt electrode is interposed among the first plurality of coil electrode layers or among the second plurality of coil electrode layers,
wherein the shunt electrode includes a coil-shaped pattern overlapping the first plurality of coil electrode layers in a direction along which the first plurality of coil electrode layers are stacked, or overlapping the second plurality of coil electrode layers in a direction along which the second plurality of coil electrode layers are stacked.

10. The common mode filter of claim 9, wherein the first plurality of coil electrode layers are stacked in a thickness direction and the second plurality of coil electrode layers are stacked in the thickness direction, and the first plurality of coil electrode layers and the second plurality of coil electrode layers are disposed in a length direction perpendicular to the thickness direction.

11. The common mode filter of claim 9, further comprising:
a plurality of external electrodes disposed on surfaces of the body portion in a width direction and electrically connected to the first and second filter portions; and
one or more ground electrodes disposed on surfaces of the body portion in a length direction and electrically connected to the shunt electrode layer.

12. The common mode filter of claim 11, wherein the shunt capacitor is connected between the one or more ground electrodes and a node of two of the first plurality of coil electrode layers or a node of two of the second plurality of coil electrode layers.

13. A common mode filter comprising:
a body portion;
a first filter portion embedded in the body portion and including a first plurality of coil electrode layers; and
a second filter portion embedded in the body portion and including a second plurality of coil electrode layers occupying an area different from that of any of the first plurality of coil electrode layers; and
a shunt capacitor formed of a shunt electrode is interposed among the first plurality of coil electrode layers or among the second plurality of coil electrode layers,
wherein the shunt electrode includes a C-shape pattern overlapping innermost and outermost patterns of the first plurality of coil electrode layers in a direction along which the first plurality of coil electrode layers are stacked, or overlapping innermost and outermost patterns of the second plurality of coil electrode layers in a direction along which the second plurality of coil electrode layers are stacked.

14. The common mode filter of claim 13, wherein the first plurality of coil electrode layers are stacked in a thickness direction and the second plurality of coil electrode layers are stacked in the thickness direction, and the first plurality of coil electrode layers and the second plurality of coil electrode layers are disposed in a length direction perpendicular to the thickness direction.

15. The common mode filter of claim 13, further comprising:
a plurality of external electrodes disposed on surfaces of the body portion in a width direction and electrically connected to the first and second filter portions; and
one or more ground electrodes disposed on surfaces of the body portion in a length direction and electrically connected to the shunt electrode layer.

16. The common mode filter of claim 15, wherein the shunt capacitor is connected between the one or more ground electrodes and a node of two of the first plurality of coil electrode layers or a node of two of the second plurality of coil electrode layers.

17. The common mode filter of claim 13, wherein the shunt electrode has the C-shaped pattern overlapping the innermost and outermost patterns of the first plurality of coil electrode layers in the direction along which the first plurality of coil electrode layers are stacked,
the common mode filter further comprises another shunt capacitor formed of another shunt electrode interposed among the second plurality of coil electrode layers, and
the other shunt electrode includes a C-shaped pattern overlapping innermost and outermost patterns of the second plurality of coil electrode layers in the direction along which the second plurality of coil electrode layers are stacked.

18. The common mode filter of claim 17, wherein the C-shaped pattern of the shunt electrode is bent toward one surface of the body portion in a width direction, and the C-shaped pattern of the other shunt electrode is bent toward another surface of the body portion in the width direction opposing the one surface.

* * * * *